(12) United States Patent
Wang et al.

(10) Patent No.: US 10,218,072 B2
(45) Date of Patent: Feb. 26, 2019

(54) BULK ACOUSTIC WAVE MEDIATED MULTIFERROIC ANTENNAS

(71) Applicant: THE REGENTS OF THE UNIVERSITY OF CALIFORNIA, Oakland, CA (US)

(72) Inventors: Yuanxun Ethan Wang, Manhattan Beach, CA (US); Gregory P. Carman, Los Angeles, CA (US); Robert Norris Candler, La Canada Flintridge, CA (US); Scott Keller, Long Beach, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 245 days.

(21) Appl. No.: 15/171,956

(22) Filed: Jun. 2, 2016

(65) Prior Publication Data
US 2018/0115070 A1    Apr. 26, 2018

Related U.S. Application Data

(60) Provisional application No. 62/172,304, filed on Jun. 8, 2015.

(51) Int. Cl.
*H01Q 7/08* (2006.01)
*H01Q 7/06* (2006.01)
*H03H 9/22* (2006.01)
*H03H 9/17* (2006.01)
*H01Q 1/52* (2006.01)
*H01Q 7/00* (2006.01)
*H01Q 3/44* (2006.01)

(52) U.S. Cl.
CPC .............. *H01Q 7/06* (2013.01); *H01Q 1/52* (2013.01); *H01Q 7/00* (2013.01); *H03H 9/173* (2013.01); *H03H 9/22* (2013.01); *H01Q 3/44* (2013.01)

(58) Field of Classification Search
CPC .. H01Q 7/06; H01Q 1/52; H01Q 7/00; H03H 9/173; H03H 9/22
See application file for complete search history.

(56) References Cited

U.S. PATENT DOCUMENTS

| | | | |
|---|---|---|---|
| 8,803,751 B1 * | 8/2014 | Miller | H01Q 1/28 343/787 |
| 2009/0027280 A1 * | 1/2009 | Frangioni | A61K 49/0032 343/703 |
| 2011/0062955 A1 * | 3/2011 | Miller | G01R 33/18 324/249 |

FOREIGN PATENT DOCUMENTS

GB         2455749 A  *  6/2009   ............. H01Q 1/364

* cited by examiner

*Primary Examiner* — Dieu H Duong
(74) *Attorney, Agent, or Firm* — O'Banion & Ritchey LLP; John P. O'Banion (57) ABSTRACT

An antenna apparatus utilizing bulk acoustic wave (BAW) resonances to transfer dynamic strain across multiple layers, which include piezoelectric layers coupled to magnetostrictive material layers. In at least one embodiment, a piezoelectric layer is coupled to a magnetostrictive layer to which another layer having similar acoustic properties as the piezoelectric layer is coupled as an inertial buffer. These multiple layers comprise a strain media to provide a vertical multiferroic coupling which couples electric field, magnetic field, and mechanical fields. Electrodes are coupled to excite one of the piezoelectric layers for injecting acoustic waves into the structure from which electromagnetic radiation is generated out of the plane.

21 Claims, 6 Drawing Sheets

FIG. 1

$$d = \frac{\lambda_{ac}}{2}$$

$d = \lambda_{ac}$

BULK ACOUSTIC WAVE MEDIATED MULTIFERROIC ANTENNAS

CROSS-REFERENCE TO RELATED APPLICATIONS

This application claims priority to, and the benefit of, U.S. provisional patent application Ser. No. 62/172,304 filed on Jun. 8, 2015, incorporated herein by reference in its entirety.

STATEMENT REGARDING FEDERALLY SPONSORED RESEARCH OR DEVELOPMENT

This invention was made with Government support under 1160504, awarded by the National Science Foundation. The Government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to radio frequency antennas, and more particularly to a bulk acoustic wave mediated multiferroic antenna for radio frequencies.

2. Background Discussion

Traditional antennas, including dipoles and loops, generate propagating electromagnetic waves from conductive currents exposed in free space. These antennas, however, radiate poorly when placed at a short distance above a conducting plane. This is because an image current flowing in the opposite direction is generated by the platform and it cancels the radiation of the original antenna. The platform effect is also described by the excessive storage of reactive energy between the radiating element and the platform, which elevates the radiation Q factor and makes the antenna difficult to match.

Using magneto-dielectric material to reduce the high radiation Q factor associated with the platform effect has been studied in the literature, where optimization of the bandwidth and efficiency performance of specific antenna structures, such as microstrip patch antennas, have been discussed. The usage of both natural magnetic material and artificial magnetic material to alleviate the platform effect has been considered.

Recently, the emergence of multiferroic material that couples electric field, magnetic field, and mechanical field has received increased attention. In particular, these materials comprise the composite of piezoelectric and magnetostrictive material in which the mechanical strain mediates the coupling of the electric polarization field and the magnetic polarization (magnetization) field, wherein the material can exhibit the high levels of multiferroic coupling needed for practical applications. It has been proposed to utilize such composite multiferroic materials to miniaturize the RF antenna dimensions because they exhibit high permittivity and high permeability simultaneously. Another proposed application of composite multiferroic material is the creation of frequency reconfigurable antennas by altering the magnetic properties of the material with electric field.

A new class of antennas called strain mediated multiferroic antennas have also been recently proposed which utilize composite multiferroic materials, however, relying on its dynamic multiferroic coupling property instead of static tunability. Dynamic electric flux (displacement current) or magnetic flux is utilized in place of conductive current as the detection mechanism in a receiver. On the other hand, dynamic strain caused electric flux or magnetic flux can also be used as the radiation source as the dynamic flux density forms the aperture field on the surface of the antenna structure. This aperture field results in outgoing electromagnetic waves, as envisioned and formulated in early days.

However, these proposed techniques fail to overcome issues with antenna radiation efficiency in close proximity to a conducting plane.

Accordingly, a need exists for multiferroic antennas which overcome radiation efficiency issues when proximal to a conducting plane. The present disclosure overcomes these shortcomings.

BRIEF SUMMARY

An antenna structure which relies on bulk acoustic wave (BAW) resonances to transfer dynamic strain across different layers. This method is different from that which has been proposed in the literature, in which the length and the width of the material were gauged to create resonances. A key feature of the disclosure is the translation of the electromagnetic resonance characteristic of an antenna into an acoustic resonance characteristic, which is performed as described herein by using mechanical coupling effects. It should be noted that previous multiferroic antennas have been based on manipulating EM properties such as permittivity or permeability.

In this disclosure, BAW resonance modes are formed vertically across the layers and they are called as the "thickness modes". Analyses of this technique shows that, the radiation quality factor of these BAW mediated antennas can be significantly lowered with high permeability and a high magnetic to mechanical coupling figure of merit in the magnetostrictive material, which thus allows creation of low-profile antennas with high radiation efficiency.

Using the disclosed technique a multiferroic antenna can be built with a thickness of only a few micrometers above a conducting plane provided that the relative permeability of the magnetic material can reach to a few thousands and the magnetomechanical coupling figure of merit exceeds about 85%.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

FIG. 2A through FIG. 4C are diagrams, images and plots depicting three different BAW resonant modes of the antenna structure according to an embodiment of the disclosed technology.

DETAILED DESCRIPTION

1. Introduction.

Figure 1:
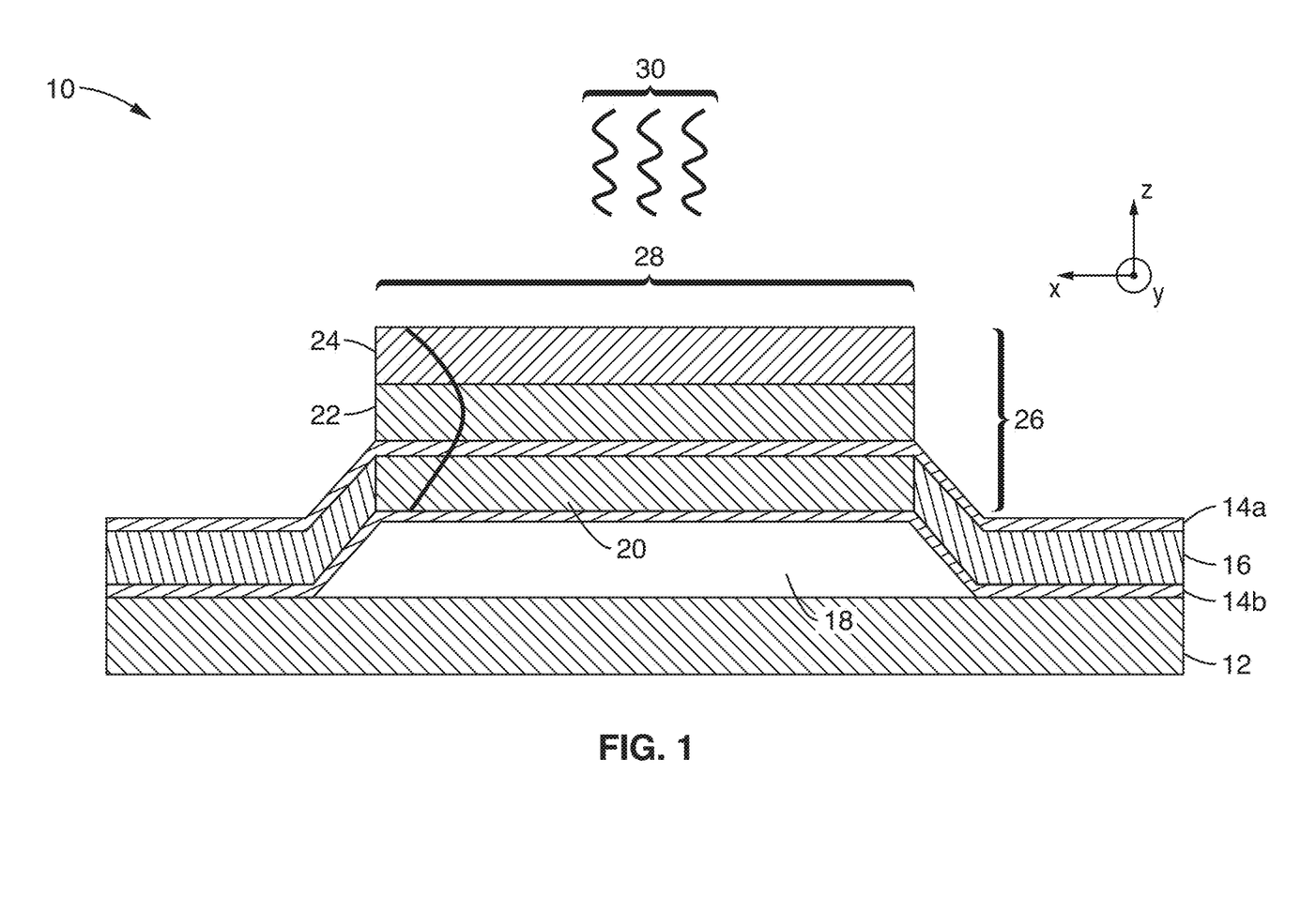
FIG. 1 is a schematic of an embodiment of the bulk-acoustic-wave (BAW) based multiferroic antenna according to an embodiment of the disclosed technology.

FIG. 1 illustrates an example embodiment 10 of BAW based multiferroic radiating elements, comprising a sandwich 26 of three layers of materials disposed in close proximity over a substrate (base) 12 material. Of these three layers, bottom layer 20 is a piezoelectric material, the middle layer is a magnetostrictive material 22, and an optional top layer 24 provides an acoustic buffer layer (or inertial buffer layer), such as comprising a material having a similar acoustic property to that of the piezoelectric material layer. The acoustic properties of this third layer are sufficiently similar to allow sufficient acoustic excitation and resonance so that this third layer acts as a counter mass during resonance.

It should be appreciated that this embodiment uses two layers of material up to a multiplicity of layers, interleaving piezoelectric materials of the same or different types with magnetostrictive materials of the same or different types. The material layers are sized according to their respective material properties to enhance, for example, resonant characteristic or quality factor or other properties desirable to the operation of an antenna structure. The piezoelectric material can in some embodiments be Alumina Nitride (AlN), but the desired electroelastic coupling can be achieved with a wide variety of electroelastic materials such as Lithium Niobate, Lead Zirconate Titanate (PZT), lead magnesium Niobate-Lead Titanate (PMN-PT), Lead Magnesium Niobate (PMN), Quartz or other materials with suitable electric polarization to strain characteristics. The magnetostrictive material can in some embodiments be Nickel (Ni), but the desired magnetoelastic coupling can be achieved with a wide variety of magnetoelastic materials such as Permalloy, Terfenol-D, YiG, CoFeB, FeGaB, $NiMgZnO_3$, Metglas, or other materials with suitable magnetization to strain characteristics.

In general, the use of the acoustic buffer layer 24 in FIG. 1, provides symmetric acoustic mode excitation in the current embodiment. This layer need not be of a specific material, nor does this layer even need to be present, because (1) there are other means for distributing mass to achieve inertial confinement, and (2) applications exist in which symmetry is not strictly necessary.

In the embodiment of FIG. 1, the resonant modes which are being excited are based on "squeezing" the magnetoelectric layer in the middle of two layers. In this configuration the acoustic buffer layer provides a counter mass, so when the first layer accelerates upward, the inertial resistance of the third layer forces the magnetostrictive layer to strain. When the acceleration reverses, the first layer pulls downward and the inertial resistance of the third layer "pulls up" on the magnetostrictive layer. The oscillations set up a resonance where the first and third layers move in opposite directions exerting the most strain on the middle layer. Thus, use of this acoustic buffer layer, such as a material matching the acoustic characteristics of the first layer, provide a simple means of optimizing inertial characteristics, although since the outer (third) layer is not electrically excited it is essentially an acoustic ballast.

Accordingly, the acoustic/inertial buffer layer sandwiches the magnetostrictive layer to help strain it. However, it should be appreciated that an arbitrary number of different ways exist for providing this inertial function. It will be appreciated that the third layer is preferably non-conductive and would ideally be electrically impedance matched to the middle layer so that the EM wave passes through undisturbed (or at least minimally damped in the electric sense). A conductive third layer could prevent an EM wave from penetrating through as well. This third layer is thus not acting as a radiating element so to speak, but more in the capacity of a "conduit" that the wave passes through. Yet, since it is the outer surface from which the wave enters into free space, no doubt one could still rightfully refer to this as a "radiating" surface, but as indicated above this is not the case in a causal sense (i.e., the oscillating magnetization in the magnetostrictive layer generates or causes the EM wave in this case).

Other embodiments are contemplated in which electrodes are added to this third layer, turning it from an acoustic buffer to an active driver toward increasing performance. In addition, using multiple layers of interleaved piezoelectric and magnetostrictive materials, then different signals, such as containing different phase and/or frequency characteristics, can be applied to these different active piezoelectric layers within the multiple layer strain media to acoustically sum these inputs at the antenna itself without electrically coupling/loading these electrical signals onto one another; as they retain their electrical isolation.

The advantage of BAW is that the coupling between the ferroelectric phase and the ferromagnetic phase is expected to be more efficient in a more effectively confined structure. The BAW antenna is constructed in the out-of-plane dimension, while retaining the ability to be scaled up in the other two in-plane dimensions for practical antenna applications. The three-layer multiferroic structure with Bulk Acoustic Waves as strain media are used to achieve vertical multiferroic coupling in addition to the horizontal scalability.

A cavity 18, for example an air cavity, is seen beneath the layered structure to overcome the clamping effect of the substrate. This embodiment utilizes a gap filled with air or other material suitable for mechanically decoupling layered resonator materials from the substrate. In other embodiments, the gap may be replaced with liquid or solid materials that enhance resonator performance and/or are placed on a specific substrate that may or may not interact with the resonator assembly to tune radiation characteristics of the device. Substrate and/or gap materials may be in-active or active as well, with active materials conceptually providing dynamic tune-ability of the device during operation. In the figure, the piezoelectric layer 20 is seen disposed within a structure layer 16, exemplified as $SiO_2$, which is shaped to form gap 18. In addition this structure layer is shown containing electrodes 14a, 14b on its upper and lower surfaces, which connect to the upper and lower surfaces of piezoelectric layer 20. It should be appreciated, however, that the electrodes may be coupled to each driven piezoelectric layer in a variety of ways without departing from the teachings of the present disclosure.

A BAW multiferroic antenna operating around the frequency of 1 GHz is shown generating electromagnetic radiation 30 in the vertical direction above structure 26. A device for this frequency for example, may consist of a 1 μm thick magnetostrictive layer sandwiched by two 1 μm thick piezoelectric layers as shown in the figure. The practical range for the thickness of these layers with the technology described is approximately 200 nanometers to 2 microns. In this example the width 28 of the structure is shown as 1 mm. It will be appreciated that the present disclosure is not limited to the thicknesses, length, width, and geometries as exemplified in the present embodiment, as these parameters are to be selected for the given application, power and frequency of operation desired.

It should also be appreciated that layer thickness ratios are partially determined by manufacturing capability. Presently it is difficult to fabricate thick piezoelectric layers in this type of device. However, utilizing advanced fabrication techniques, such as 3D printing or similar techniques, to fabricate thicker layers can open up the use of the disclosed technology for lower RF operating bands, for which there is significant interest. Thus, it will be appreciated that the embodiments of the present invention may be implemented with these alternative techniques for fabricating layers in wider thickness ranges, such between approximately 200 nanometers and 2 millimeters.

The bottom piezoelectric layer 20 serves as the excitation layer, which injects the acoustic waves into the layered structure. Vertical BAW resonance is formed and it maximizes the strain coupled to the magnetoelastic layer at the resonating frequency. It is important to point out that this structure can be readily expanded into multiple layers vertically and to larger dimensions horizontally for more efficient radiation. Stacked layers of piezoelectric, magnetostrictive and electrode materials can be replicated as shown in this embodiment or the geometric configuration and ratios of piezoelectric to magnetostrictive material and electrode placement can be varied to adjust resonant mode or damp out unwanted modes. Independent of vertical geometric configuration, horizontal extent of resonator structures can be adjusted to maximize efficiency or patterned for more complex antenna operational characteristics such as beamsteering or directivity enhancement.

One unique characteristic of BAW mediated antennas is that its resonant frequencies are independent of the horizontal dimensions. This distinguishes the proposed antenna from other existing antennas and offers a great flexibility in performing impedance matching and shaping the radiation pattern of the antenna. Below is a brief description of the analytical/numerical results is presented followed by fabrication and testing data.

2. Simulation and Experimental Results.

The energy coupling between the BAW modes and the ferromagnetic phase is through the dynamic mechanical strain and different resonant modes have different stress or strain profiles. Thus, different resonance modes have different radiation characteristics. A Finite Difference Time Domain (FDTD) code can be utilized for simulating the dynamic, two-way coupling between acoustic waves and electromagnetic waves, with results shown below.

Figure 2A:
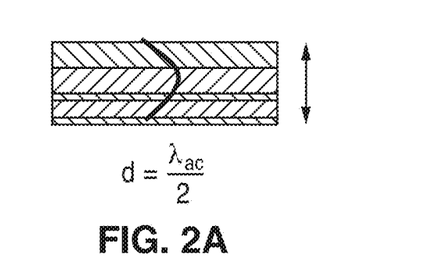
Figure 2B:
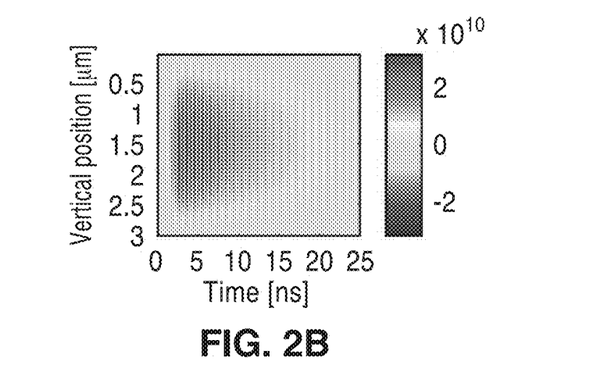
Figure 2C:
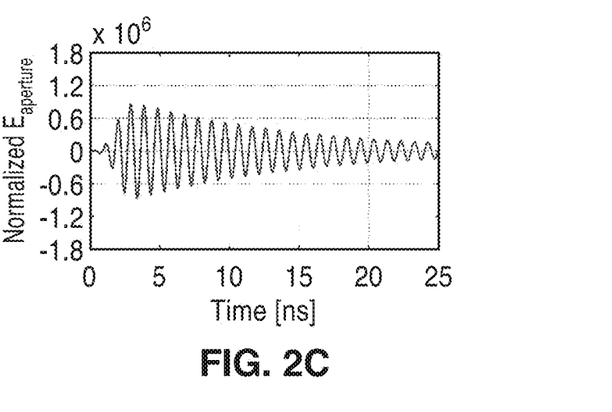
Figure 3A:
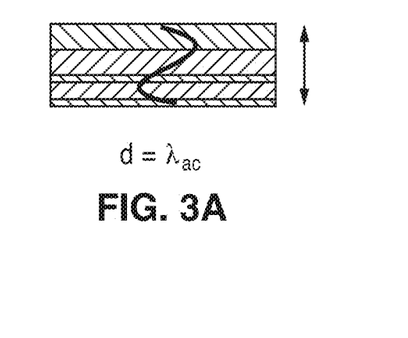
Figure 3B:
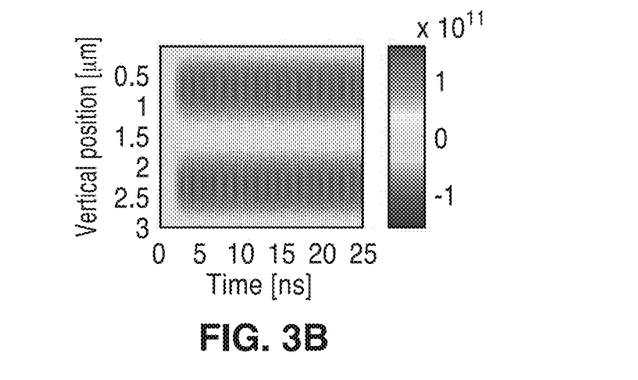
Figure 3C:
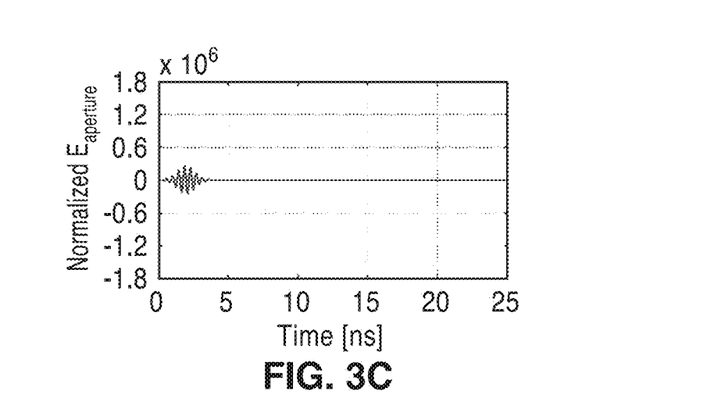
Figure 4A:
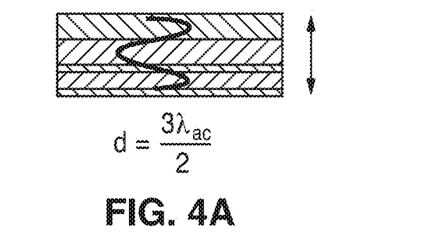
Figure 4B:
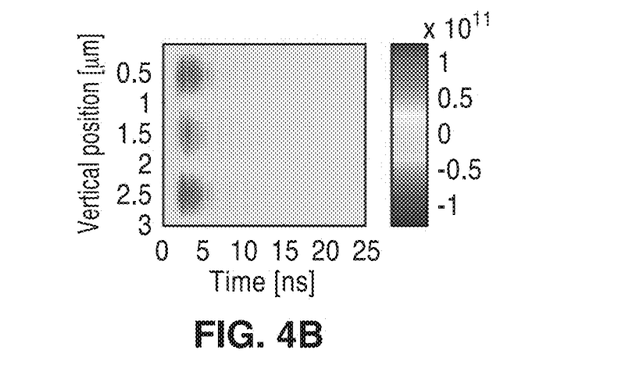
Figure 4C:
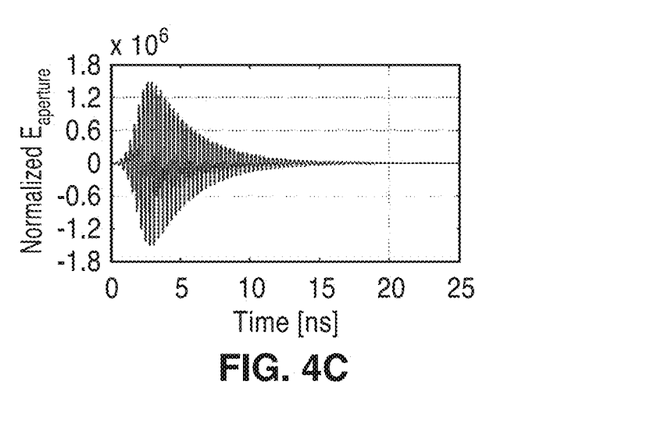

FIG. 2A through FIG. 4C depict simulated results for the antenna of FIG. 1. Shown in FIG. 2A, FIG. 3A, and FIG. 4A are simulated stress profiles of the first three BAW modes, with a custom developed FDTD program. One interesting phenomenon is that the even order BAW modes may exhibit minimum coupling with the magnetic phase due to the fact the stress and strain has a nearly null value in the magnetic layer. The absence of the mechanical-to-magnetic coupling at the even modes prevents electromagnetic radiation (i.e., magnetic dipoles are not oscillating), which explains the simulated result seen in FIG. 2B, FIG. 3B, FIG. 4B, FIG. 2C, FIG. 3C and FIG. 4C, which are the stress profile as a function of time and aperture field outside the magnetic layer, respectively. In FIG. 2B, FIG. 3B and FIG. 4B it can be seen that the stress in the BAW structure decays quickly for the first mode and the third mode due to the radiation of the electromagnetic energy, while the second mode barely decays as the energy is bound within the structure without being coupled to the magnetic layer. This statement is further confirmed in the plots of FIG. 2C, FIG. 3C and FIG. 4C, which depict direct indication of EM radiation. In particular, it can be seen in these figures that the aperture electric field is significant for the first and the third mode while the aperture field for the second mode virtually does not exist after the original excitation is completed.

Figure 5:
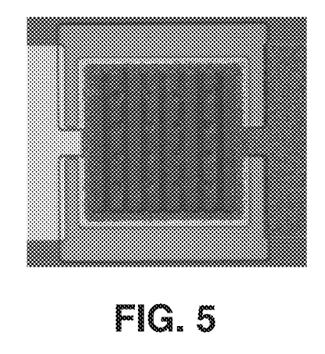
FIG. 5 is an image of a fabricated BAW based multiferroic device according to an embodiment of the disclosed technology.

FIG. 5 illustrates an example of a multiferroic BAW antenna fabricated according to the present disclosure, and in particular based on the analytical design discussed in the preceding sections. Short loop experiments were performed to assess each process step. The fabricated BAW structure consists of tri-layer lamination of the piezoelectric Alumina Nitride (AlN), magnetoelastic nickel strips (i.e., strips to prevent eddy current losses), and a dummy Silicon Nitride layer to match the acoustic velocity. Examples of process steps developed and verified are deposition of approximately 750 nm each of low stress Nickel and high quality Aluminum Nitride.

A test-setup utilized a Ground-Signal-Ground (GSG) probe for electrically exciting the piezoelectric layer with an incident electromagnetic wave and a contactless local probe acting as a receiving antenna to measure radiation or any electromagnetic field generated from the BAW structure. The samples have been tested with vector network analyzer for their RF performance.

Figure 6:
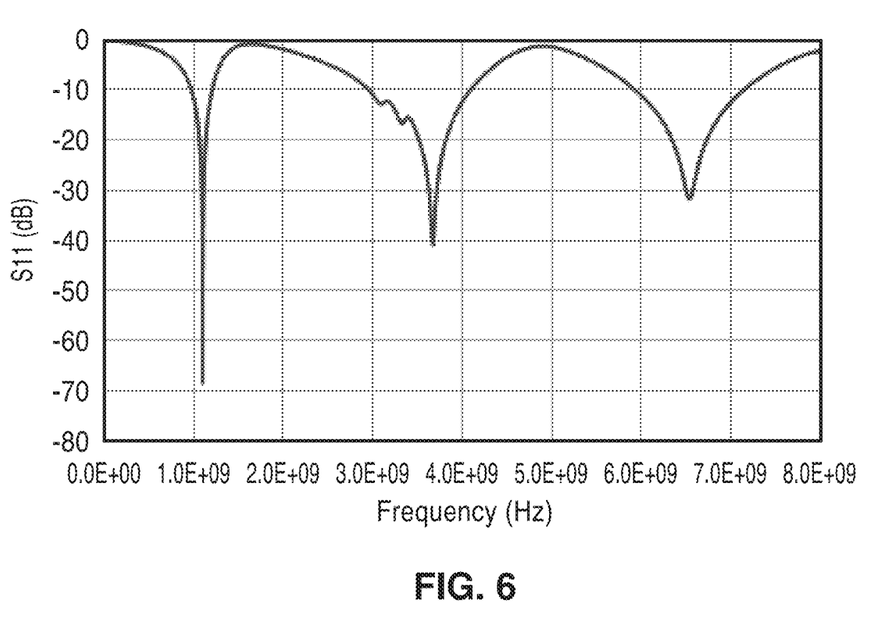
FIG. 6 is a plot of measured reflection coefficient (S11) for the BAW radiating element in an example diameter of 100 μm.

FIG. 6 illustrates measured reflection coefficient versus frequency from the piezoelectric input of a 100 μm diameter BAW structure constructed according to the example of FIG. 1 and FIG. 6. Deep notches can be seen in the plot at the odd modes and the energy absorbed by the device is very efficient given that the depth of the notches are from 30 dB to 70 dB. These deep notches are unusual for a BAW device containing only piezoelectric material. However, for the multiferroic antenna device the mechanical energy is converted into the magnetic phase through magnetoelastic coupling, and is subsequently either dissipated or radiated. The fact that the notches in FIG. 6 are at odd modes and that all even modes are missing was also predicted by the previous FDTD modeling as indicated in the previous paragraph. The absence of even modes and presence of odd modes is a clear indication that the operation of strain-mediated multiferroics functions as outlined above and as predicted by the modeling.

Figure 7:
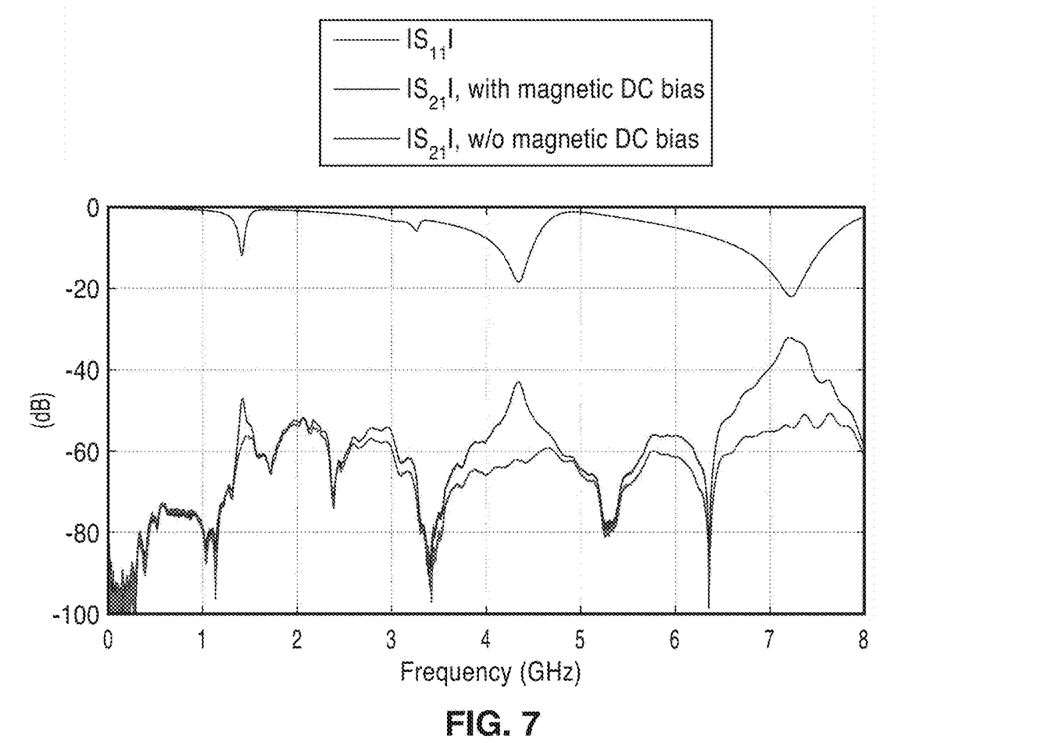
FIG. 7 are plots of measured reflection coefficient and the transmission between the BAW structure and the receiving loop antenna, according to an embodiment of the disclosed technology.

FIG. 7 illustrates results from reflection and transmission tests performed with a loop antenna 5 mm away from one BAW device with a 50 μm diameter sample. The upper curve in the figure is the $|S_{11}|$ reflection coefficient. Two lower curves present $|S_{21}|$ forward transmission coefficient (gain), with the curve containing the higher peaks being with magnetic bias, and the lower curves showing forward transmission without magnetic DC bias. For the transmission test, the electromagnetic wave was launched (i.e., voltage to electrodes oscillated) into the BAW structure through the piezoelectric layer. During this test, a contactless probe was placed a few millimeters away to detect any near field electromagnetic field generated or radiated by the BAW structure. The tests were conducted with a magnetic field applied to the BAW and without a magnetic field applied to a BAW. That is, a magnetic field should only modify the radiation characteristics if indeed the magnetic layer was radiating energy. Both the reflection coefficient and the transmission coefficients versus frequency are seen plotted in FIG. 7, with and without an external magnetic bias. A similar behavior was observed in the reflection coefficient, where multiple dips were observed at the odd modes of the BAW. It is difficult to identify any features in the transmission curve for the case without magnetic biasing, due to the great loss of the ferromagnetic material (Nickel) in an unsaturated, zero biasing condition. The peaks over the resonant frequencies indicate the capturing of electromagnetic field emitted from the BAW structures at those modes. The emission is dramatically enhanced with the external biasing field and clear radiation signals are being measured at each of the odd resonance frequencies of the BAW device.

3. Conclusions.

The present disclosure demonstrates a class of BAW mediated multiferroic antennas applicable to matching and efficiency enhancement of electrically small, low profile antennas operating at radio frequencies. Antennas fabricated according to the present disclosure can provide improved radiation efficiency, shape independent impedance matching and increased robustness in regard to their mounting platforms.

From the description herein, it will be appreciated that the present disclosure encompasses multiple embodiments which include, but are not limited to, the following:

1. A bulk acoustic wave mediated multiferroic antenna apparatus, comprising: (a) multiple layers within a multiple layer strain media, comprising: (a)(i) at least one piezoelectric material layer having a first set of acoustic properties; (a)(ii) at least one magnetostrictive material layer coupled to said piezoelectric material layer; (b) wherein said at least one piezoelectric material layer and said at least one magnetostrictive material are disposed in an out of plane dimension in relation to the emitted electromagnetic radiation from said apparatus; (c) wherein said at least one piezoelectric material layer and said at least one magnetostrictive material are coupled together into a multiple layer strain media to provide a vertical multiferroic coupling which couples electric field, magnetic field, and mechanical field; and (d) at least two electrodes coupled to one or more layers of said at least one piezoelectric material layer for exciting that layer, or layers, to inject acoustic waves into the multiple layer strain media, from which electromagnetic radiation is generated out of the plane on the exterior of said apparatus; (e) wherein injection of acoustic waves into the multiple layer strain media induces a resonance mode in the entire apparatus which creates substantial strain in said at least one magnetostrictive material layer, which results in oscillating magnetization which produces a radiating electromagnetic RF wave which is emitted from said apparatus which is operating as an antenna.

2. The apparatus of any preceding embodiment, wherein said multiple layer strain media further comprises at least one acoustic buffer layer configured as an acoustic or inertial damper coupled to said magnetostrictive material layer and having acoustic properties for receiving acoustic waves transmitted from said at least one piezoelectric material layer and through said at least one magnetostrictive material layer.

3. The apparatus of any preceding embodiment, wherein said apparatus operates in response to using a coupled acoustic resonant mode, driven by electrodes exciting said at least one piezoelectric material layer which subsequently drives electromagnetics through strain coupling in which geometric characteristics determine the excited mode, to excite magnetic fluctuation through strain coupling.

4. The apparatus of any preceding embodiment, wherein said at least one piezoelectric material layer comprises a material having a sufficient electric polarization to strain characteristic, wherein upon sufficient electrically excitation it causes injection acoustic waves into said multiple layer strain media.

5. The apparatus of any preceding embodiment, wherein said at least one piezoelectric material layer comprises an electroelastic material having sufficient magnetization-to-strain characteristics to excite said multiple layer strain media into acoustic oscillation.

6. The apparatus of any preceding embodiment, wherein said electroelastic material is selected from a group of electroelastic materials consisting of Alumina Nitride (AlN), Lithium Niobate, Lead Zirconate Titanate (PZT), Lead Magnesium Niobate Titanate (PMN-PT), Lead Magnesium Niobate (PMN), and Quartz.

7. The apparatus of any preceding embodiment, wherein said at least one magnetostrictive material layer comprises a magnetoelastic material having magnetization-to-strain characteristics which create said oscillating magnetization in response to strain induced by excitation from said at least one piezoelectric or electroelastic material.

8. The apparatus of any preceding embodiment, wherein said at least one magnetostrictive material layer comprises Alumina Nitride (AlN).

9. The apparatus of any preceding embodiment, wherein said at least one magnetostrictive material layer is selected from a group of magnetoelastic material consisting of Permalloy, Terfenol-D, YiG, CoFeB, FeGaB, NiMgZnO3, and Metglas.

10. The apparatus of any preceding embodiment, wherein said at least one piezoelectric material layer comprises multiple piezoelectric material layers, and said at least one magnetostrictive material layer comprises multiple magnetostrictive material layers, and wherein said multiple piezoelectric material layers and said multiple magnetostrictive material layers are interleaved.

11. The apparatus of any preceding embodiment, wherein said RF wave is emitted from an external layer comprising said at least one acoustic buffer layer.

12. The apparatus of any preceding embodiment, further comprising a substrate layer and a structure for retaining said multiple layer strain media.

13. The apparatus of any preceding embodiment, wherein said gap comprises air or a material for mechanically decoupling said multiple layer strain media from said substrate.

14. The apparatus of any preceding embodiment, wherein said structure for retaining said multilayer structure comprises a dielectric material.

15. The apparatus of any preceding embodiment, wherein said dielectric material comprises silicon nitride.

16. The apparatus of any preceding embodiment, wherein thickness for each layer within said multiple layer strain media are between 200 nanometers and 2 millimeters.

17. The apparatus of any preceding embodiment, wherein a coefficient of magneto-mechanical coupling approaches its peak near ferromagnetic resonance (FMR) of said multiple layer strain media.

18. The apparatus of any preceding embodiment, wherein resonant frequencies of said apparatus is independent of its horizontal dimensions.

19. A bulk acoustic wave mediated multiferroic antenna apparatus, comprising: (a) multiple layers within a multiple layer strain media, comprising: (a)(i) at least one piezoelectric material layer having a first set of acoustic properties; (a)(ii) at least one magnetostrictive material layer coupled to said piezoelectric material layer; and (a)(iii) at least one acoustic buffer layer configured as an acoustic or inertial damper having acoustic properties for receiving acoustic waves transmitted from said at least one piezoelectric material layer, and through said at least one magnetostrictive material layer; (b) a substrate layer and a structure for retaining said multiple layer strain media to retain a gap for mechanically decoupling said multiple layer strain media from said substrate; (c) wherein said at least one piezoelectric material layer, said at least one magnetostrictive material, and said at least one acoustic buffer layer are disposed in an out of plane dimension in relation to the emitted electromagnetic radiation from said apparatus; (d) wherein said at least one piezoelectric material layer, said at least one magnetostrictive material, and said at least one acoustic buffer layer are coupled together into a multiple layer strain media to provide a vertical multiferroic coupling which couples electric field, magnetic field, and mechanical field; and (e) at least two electrodes coupled to one or more layers of said at least one piezoelectric material layer for exciting that layer to inject acoustic waves into the multiple layer strain media, from which electromagnetic radiation is generated out of the plane of a terminal layer on the exterior of said apparatus; (f) wherein injection of acoustic waves into the multiple layer strain media induces a resonance mode in the entire apparatus which creates substantial strain in said at least one magnetostrictive material layer, which results in oscillating magnetization which produces a radiating electromagnetic RF wave which is emitted from said apparatus; and (g) whereby said apparatus operates in response to using a coupled acoustic resonant mode, driven by electrodes exciting said at least one piezoelectric material layer which subsequently drives electromagnetics through strain coupling in which geometric characteristics determine the excited mode, to excite magnetic fluctuation through strain coupling.

20. The apparatus of any preceding embodiment, wherein said RF wave is emitted from an external layer comprising said at least one acoustic buffer layer.

21. A method of generating multiferroic resonance for an antenna, comprising: (a) coupling a radio-frequency electric field signal into one or more piezoelectric layers to generate bulk acoustic wave resonance; and (b) generating dynamic magnetization in response to magnetostriction of said bulk acoustic wave resonance within one or more magnetostrictive layers.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A bulk acoustic wave mediated multiferroic antenna apparatus, comprising:
   (a) a substrate layer;
   (b) multiple layers within a multiple layer strain media, comprising:
      (i) at least one piezoelectric material layer having a first set of acoustic properties;
      (ii) at least one magnetostrictive material layer coupled to a first side of said piezoelectric material layer;
      (iii) a structure layer extending from a second side of said piezoelectric material layer to said substrate layer and which is shaped to create a gap or cavity between said piezoelectric material layer and said substrate to mechanically decouple said multiple layer strain media from said substrate;
   (c) wherein said at least one piezoelectric material layer and said at least one magnetostrictive material layer are disposed in an out of plane dimension in relation to the emitted electromagnetic radiation from said apparatus;
   (d) wherein said at least one piezoelectric material layer and said at least one magnetostrictive material layer are coupled together into the multiple layer strain media to provide a vertical multiferroic coupling which couples electric field, magnetic field, and mechanical field; and
   (e) at least two electrodes coupled to one or more layers of said at least one piezoelectric material layer for exciting that layer, or layers, in response to receiving radio-frequency electric field signals to inject acoustic waves into the multiple layer strain media, from which electromagnetic radiation is generated out of the plane on the exterior of said apparatus;
   (f) wherein injection of acoustic waves into the multiple layer strain media induces a resonance mode in the entire apparatus which creates substantial strain in said at least one magnetostrictive material layer, which results in oscillating magnetization which produces a radiating electromagnetic RF wave which is emitted from said apparatus which is operating as an antenna.

2. The apparatus as recited in claim 1, wherein said multiple layer strain media further comprises at least one acoustic buffer layer configured as an acoustic or inertial damper coupled to said magnetostrictive material layer and having acoustic properties for receiving acoustic waves transmitted from said at least one piezoelectric material layer and through said at least one magnetostrictive material layer.

3. The apparatus as recited in claim 1, wherein said apparatus operates in response to using a coupled acoustic resonant mode, driven by said at least two electrodes exciting said at least one piezoelectric material layer which subsequently drives electromagnetics through strain coupling in which geometric characteristics determine the excited mode, to excite magnetic fluctuation through strain coupling.

4. The apparatus as recited in claim 1, wherein said at least one piezoelectric material layer comprises a material having a sufficient electric polarization to strain characteristic, wherein upon sufficient electrically excitation it causes injection acoustic waves into said multiple layer strain media.

5. The apparatus as recited in claim 1, wherein said at least one piezoelectric material layer comprises an electroelastic material having sufficient magnetization-to-strain characteristics to excite said multiple layer strain media into acoustic oscillation.

6. The apparatus as recited in claim 5, wherein said electroelastic material is selected from a group of electroelastic materials consisting of Alumina Nitride (AlN), Lithium Niobate, Lead Zirconate Titanate (PZT), Lead Magnesium Niobate Titanate (PMN-PT), Lead Magnesium Niobate (PMN), and Quartz.

7. The apparatus as recited in claim 1, wherein said at least one magnetostrictive material layer comprises a magnetoelastic material having magnetization-to-strain characteristics which create said oscillating magnetization in response to strain induced by excitation from said at least one piezoelectric or electroelastic material.

8. The apparatus as recited in claim 7, wherein said at least one piezoelectric material layer comprises Alumina Nitride (AlN).

9. The apparatus as recited in claim 7, wherein said at least one magnetostrictive material layer is selected from a group of magnetoelastic material consisting of Permalloy, Terfenol-D, YiG, CoFeB, FeGaB, NiMgZnO3, and Metglas.

10. The apparatus as recited in claim 1, wherein said at least one piezoelectric material layer comprises multiple piezoelectric material layers, and said at least one magnetostrictive material layer comprises multiple magnetostrictive material layers, and wherein said multiple piezoelectric material layers and said multiple magnetostrictive material layers are interleaved.

11. The apparatus as recited in claim 1, wherein said RF wave is emitted from an external layer comprising at least one acoustic buffer layer.

12. The apparatus as recited in claim 1, wherein said gap or cavity comprises air or a material for mechanically decoupling said multiple layer strain media from said substrate.

13. The apparatus as recited in claim 1, wherein said structure for retaining said multilayer structure comprises a dielectric material.

14. The apparatus as recited in claim 13, wherein said dielectric material comprises silicon nitride.

15. The apparatus as recited in claim 1, wherein thickness for each layer within said multiple layer strain media are between 200 nanometers and 2 millimeters.

16. The apparatus as recited in claim 1, wherein said vertical multiferroic coupling is fabricated in the out-of-plane dimension, whereby resonant frequencies of said apparatus is independent of horizontal dimensions of said vertical multiferroic coupling.

17. A bulk acoustic wave mediated multiferroic antenna apparatus, comprising:
  (a) a substrate layer;
  (b) multiple layers within a multiple layer strain media, comprising:
    (i) at least one piezoelectric material layer having a first set of acoustic properties;
    (ii) at least one magnetostrictive material layer coupled to a first side of each of said at least one piezoelectric material layer; and
    (iii) at least one acoustic buffer layer coupled to a magnetostrictive material layer within said at least one magnetostrictive layer, which is farthest from said substrate, said acoustic buffer layer configured as an acoustic or inertial damper having acoustic properties for receiving acoustic waves transmitted from said at least one piezoelectric material layer, and through said at least one magnetostrictive material layer;
    (iv) a structure layer extending from at least one piezoelectric material layer to said substrate layer and which is shaped to create a gap or cavity between said piezoelectric material layer and said substrate to mechanically decouple said multiple layer strain media from said substrate;
  (b) wherein said at least one piezoelectric material layer, said at least one magnetostrictive material layer, and said at least one acoustic buffer layer are disposed in an out of plane dimension in relation to the emitted electromagnetic radiation from said apparatus;
  (c) wherein said at least one piezoelectric material layer, said at least one magnetostrictive material layer, and said at least one acoustic buffer layer are coupled together into the multiple layer strain media to provide a vertical multiferroic coupling which couples electric field, magnetic field, and mechanical field; and
  (d) at least two electrodes coupled to one or more layers of said at least one piezoelectric material layer for exciting that layer, or layers, in response to receiving radio-frequency electric field signals to inject acoustic waves into the multiple layer strain media, from which electromagnetic radiation is generated out of the plane of a terminal layer on the exterior of said apparatus;
  (e) wherein injection of acoustic waves into the multiple layer strain media induces a resonance mode in the entire apparatus which creates substantial strain in said at least one magnetostrictive material layer, which results in oscillating magnetization which produces a radiating electromagnetic RF wave which is emitted from said apparatus; and
  (f) whereby said apparatus operates in response to using a coupled acoustic resonant mode, driven by electrodes exciting said at least one piezoelectric material layer which subsequently drives electromagnetics through strain coupling in which geometric characteristics determine the excited mode, to excite magnetic fluctuation through strain coupling.

18. The apparatus as recited in claim 17, wherein said RF wave is emitted from an external layer comprising said at least one acoustic buffer layer.

19. The apparatus as recited in claim 17, wherein said at least two electrodes extend on opposing sides of said structure layer to connect on opposing sides of at least one piezoelectric material layer.

20. The apparatus as recited in claim 19, wherein said gap, or cavity, comprises air or a material for mechanically decoupling said multiple layer strain media from said substrate.

21. A method of generating multiferroic resonance for an antenna, comprising:
(a) coupling a radio-frequency electric field signal into one or more piezoelectric layers to generate bulk acoustic wave resonance;
(b) generating dynamic magnetization in response to magnetostriction of said bulk acoustic wave resonance within one or more magnetostrictive layers coupled to said one or more piezoelectric layers in forming a multiple layer strain media; and
(c) creating a gap or cavity between said multiple layer strain media and a substrate layer to mechanically decouple said multiple layer strain media from said substrate.

* * * * *